United States Patent [19]

Flygstad et al.

[11] Patent Number: 4,701,640

[45] Date of Patent: Oct. 20, 1987

[54] ELECTRET TRANSDUCER AND METHOD OF FABRICATION

[75] Inventors: Dean W. Flygstad, Apple Valley; Craig E. Tromborg, Bloomington, both of Minn.

[73] Assignee: Telex Communications, Inc., Minneapolis, Minn.

[21] Appl. No.: 710,225

[22] Filed: Mar. 11, 1985

[51] Int. Cl.[4] .............................................. G11C 13/02

[52] U.S. Cl. .................................... 307/400; 307/401; 29/592 E; 381/173

[58] Field of Search ............... 307/400, 401, 402, 403, 307/405; 179/110 A, 111 R, 111 E, 107 E, 110 D, 108 EA; 381/68, 69, 111, 116, 113; 29/25.35, 25.41, 25.42, 592 R, 592 E, 594, 595; 156/632

[56] References Cited

U.S. PATENT DOCUMENTS

| | | | |
|---|---|---|---|
| 4,513,348 | 4/1985 | Grantham | 29/25.41 X |
| 4,558,184 | 12/1985 | Busch-Vishniac et al. | 29/594 X |
| 4,567,382 | 1/1986 | Halteren | 29/592 E X |

*Primary Examiner*—William M. Shoop, Jr.
*Assistant Examiner*—Shik Luen Paul IP
*Attorney, Agent, or Firm*—Warren A. Sturm

[57] ABSTRACT

An electret transducer is comprised of a motor and signal processing apparatus, that may include an amplifier and/or impedance matching means, disposed within a sealed conductive housing. The motor is fabricated in place within a housing and the signal processing means is mounted on the underside of the cover for the housing so that each may be independently tested prior to combining into a unitary structure. The motor is comprised of easily fabricated and assembled components that include means for spacing a backplate from the walls of the conductive housing and a spacer intermediate the backplate and the center of a diaphragm. The backplate and the diaphragm are provided with registering apertures. The amplifier is mounted to the cover to conductively connect to the housing and to provide rigid outwardly extending terminals for ready connection to further electrical circuits, as in a hearing aid. The component parts of the transducer are fabricated by half etching through the use of etching resist patterns that are placed in registering cooperative disposition on the surfaces of a flat sheet of material of which the components are comprised, to provide variations in thickness of predetermined portions of the finished components.

10 Claims, 9 Drawing Figures

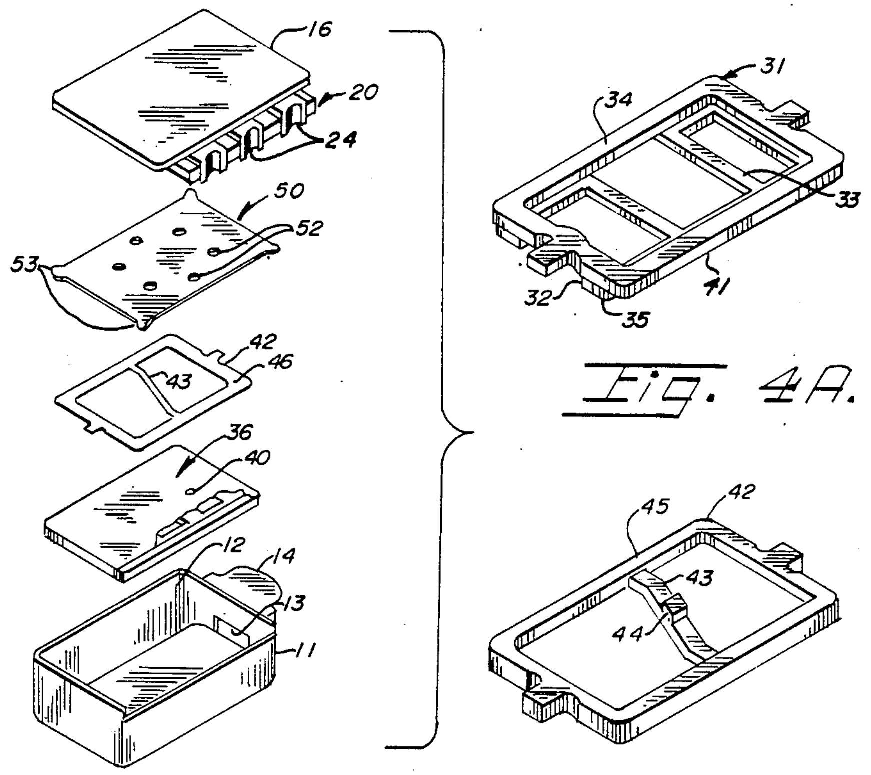
Fig. 4.
Fig. 4A.
Fig. 4B.
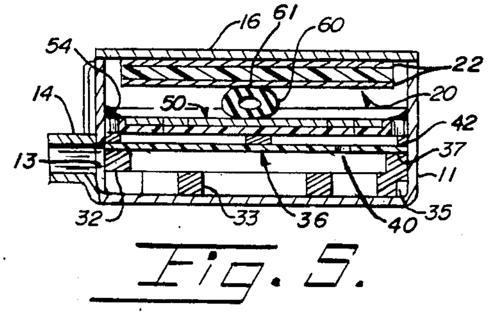
Fig. 5.

ELECTRET TRANSDUCER AND METHOD OF FABRICATION

BACKGROUND OF THE INVENTION

This invention is directed toward the field of subminiature compressional wave transducers and is more particularly directed to a transducer utilizing the electret principle of operation and to a method of fabricating such a transducer.

The prior art with which our invention is concerned arises from the well known condenser microphone type of transducer and has evolved from the discovery of the electret principle in its application to such general types of microphones and transducers.

The prior art contains numerous patents and publications relating to various forms of electret compressional wave transducers that have arrived and departed from the commercial scene. Some of these have been directed toward miniature and subminiature forms which are typically used in connection with hearing aids and the like. Whether large or small, the properties of an electret form of compressional wave transducers have proven desirable in many applications. While the superior performance of the electret form of transducer has long been recognized, its wide scale adoption has not been obtained, principally for the reasons of a decided lack of cost effectiveness. Some of the relatively high production cost have resulted from complicated structures and others have resulted from the use of manufacturing methods and techniques which may result in an undesired low percentage of acceptable products when presented in their final assembled presumably operable condition.

SUMMARY OF THE INVENTION

It is therefore an object of our invention to provide an inexpensively fabricated compressional wave electret transducer that may be constructed to be operable throughout the entire spectrum of sizes and environments.

A compressional wave electret transducer constructed in accordance with the principles of our invention is comprised of a minimal number of separate components that may be easily and efficiently fabricated of materials which cooperate to provide an improved performance and which is comprised of components that may be assembled into operable subassemblies to provide adequate testing and opportunities for quality control throughout the entire process.

Specifically, our transducer is comprised of a hollow housing, or casing, into which are assembled a diaphragm and support, a spacer, an electret backplate and a suitable electrical signal processing apparatus to present a transducer that is essentially impervious to extraneous environmental conditions, which may be characterized in its response to electrical signals or compressional wave energy and which is sealed except for a port, adapted for connection to a source of or utilization means for, compressional wave energy.

Certain of the components for our transducer are fabricated by the utilization of an improved process of providing registering etch resistant areas on opposite sides of a sheet of material, and etching halfway through the thickness of the material. This creates a method of providing a component with areas that extend completely through the component or in desired areas, extend halfway, or so, through from either surface.

Our improved electret transducer also includes a motor assembly that is comprised of a stressed diaphragm, supported at its periphery that is spaced from an electret backplate by a spacer, fabricated according to the process set forth above, that engages the active portion of the diaphragm at its center. The electret backplate is provided with a plurality of outwardly extending ears which serve to space the principal portion of the body of the backplate from the conductive metal housing. When in place in the housing, or case, the motor assembly is easily tested prior to final assembly by installation of the cover.

The electrical signal processing apparatus is mounted to the underside of the cover for the transducer case and includes outwardly extending terminals and may include an amplifier as well as impedance matching characteristics. As assembled to the cover, preassembly testing is easily accomplished.

These and other features and advantages of our invention may become apparent from a consideration of the appended specification, claims and drawings.

BRIEF DESCRIPTION OF THE DRAWINGS

FIG. 4 is an exploded view of the transducer of FIG. 1;

FIGS. 4A and 4B are enlarged sketches of corresponding components illustrated in FIG. 4;

FIG. 5 is a further elevational, sectional view on a reduced scaled of a transducer taken along section line 5—5 on FIG. 1;

DESCRIPTION OF THE ILLUSTRATED EMBODIMENT

Figure 1:
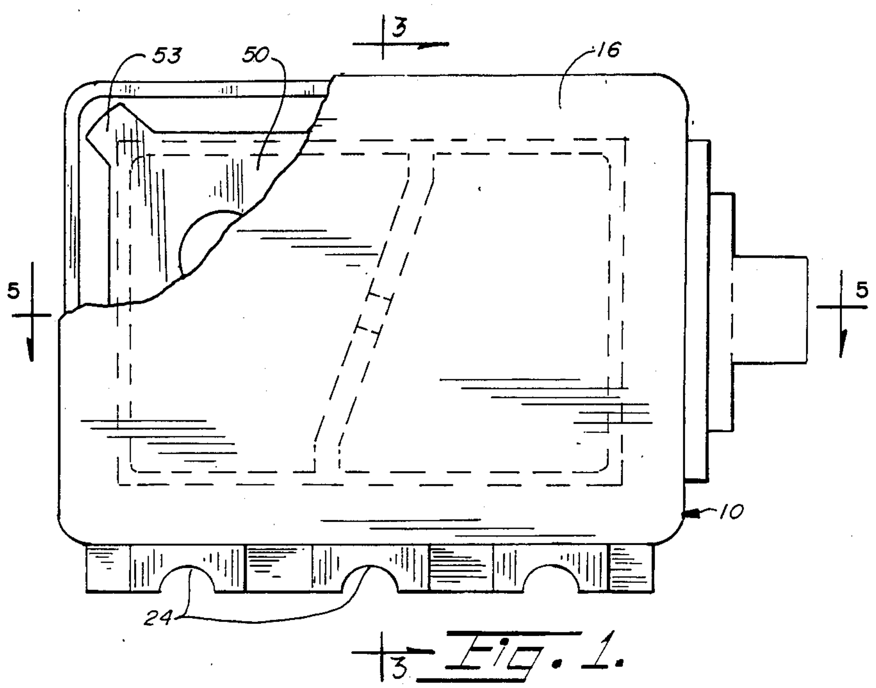
FIG. 1 is a partially broken away top plan view of an electret transducer embodying the principles of our invention.
Figure 2:
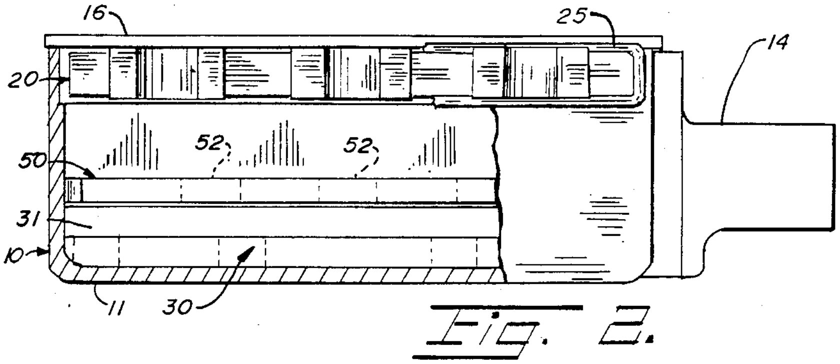
FIG. 2 is a partially broken away side elevational view of the electret transducer shown in FIG. 1.

Referring to the drawings which like elements have been identified with like reference characters, there is shown a compressional wave transducer utilizing the electret principle of operation as indicated generally by reference character 10. Transducer 10 includes a case 11 and a cover 16 with a signal processing circuit board 20 and a motor, indicated generally by reference character 30, disposed therein.

Case 11 is shown as being hollow and of generally rectangular shape with an open top 12 and an aperture 13 and snout 14 disposed near the bottom wall adjacent the bottom end of one of the four sidewalls. Cover 16 is shown disposed over the open top end of case 11 and may be fixedly attached thereto by suitable means, such as welding, or the like, to provide a complete enclosure having a single access aperture 13 for the transmission of compressional wave energy into or out of the interior. Case 11 and cover 16 may conveniently be fabricated from stainless steel by stamping and utilizing a deep drawing process for case 11 and etching for cover 16 and snout 14 may be fixedly and sealably mounted over aperture 13 by suitable means (not shown).

Circuit board 20 may be comprised of an insulating base upon which a plurality of flat conductors 22 are provided so that the upper surface presents a large area for engagement with the underside of cover 16. The undersurface of board 20 contains a plurality of discreet conductors designed to accept the terminals of predetermined electrical components to form, for example an amplifier, and through the provision of notched terminals 24, extending intermediate appropriate conductors disposed on the top and bottom of the base by extending the conductor therethrough and between, forms facile and reliable terminals 24 for convenient connection to an external source or signal utilization means (not shown).

Circuit board 20 is shown having terminals 24 extending sidewardly from the top of one of the sidewalls of case 11 through an opening and a dielectric sealant 25 is used to seal the completed structure. Circuit board 20 may preferably be fabricated by a process which plates conductive material, such as copper, in a predetermined pattern on the major surfaces and between predetermined portions so that the entire exposed periphery of notches 24 presents an uninterrupted conductive path from conductor portions 22 disposed on the upper and lower surfaces so that other conductors may be suitably soldered or otherwise conductively joined to terminals 24 to provide a junction therebetween. Appropriate circuit components, (not shown) may include, for example, FET transistors, integrated circuits or the like interconnected by conductors 22 to provide a desired predetermined impedance matching and/or gain in the level or power content of the signals applied to circuit board 20.

Circuit board 20 may be affixed to the underside of cover 16 by reflowing a solder coating on the bottom of cover 16 to engage portions of conductors 22 that are disposed on top of circuit board 20.

Motor 30 includes a conductive support-terminator 31 for receiving and holding a diaphragm 36 across its top surface 34. Support-terminator 31 is of generally "open" configuration sized to fit the interior of case 11 and therefore is comprised of a generally rectangularly shaped frame, shown with the top 34 in supporting engagement with diaphragm 36 and a bottom 41 in engagement with the interior bottom of case 11 and includes a notch 32, for compressional wave energy flow disposed at the side or end of one of the sidewalls of the frame and one or more of crossbars 33 extending intermediate oppositely disposed lower sides of the frame. Support-terminator 31 is further provided with an outwardly opening peripheral recess 35 at the bottom of the sidewalls to allow for the rounded corner portions of the lower part of case 11. Support-terminator 31 may be comprised of a suitable metallic alloy and may conveniently be fabricated through the use of the method set forth below in connection with the elements of FIG. 6.

A diaphragm 36 is attached to the top surface of support-terminator 31 by the use of suitable adhesive 37. Diaphragm 36 is provided with a metallic coating 38 on the lower surface of, for example, a polyester plastic film 39, as illustrated on FIGS. 3 and 5 of the drawings. Diaphragm 36 includes an aperture 40 in alignment with one of the apertures 52 provided in backplate 50 to be described below. Aperture 40 is of suitable size to effect a predetermined response of the overall transducer to low frequency components of compressional wave energy and may be on the order of 0.002 inches. Diaphragm 36 is typically tensioned or stressed to provide a predetermined deflection, and is maintained thusly stressed as a suitable adhesive 37, such as epoxy resin, attains a secure ohmic, conductive bond to the top of support-terminator 31.

Spacer 42, as illustrated in FIG. 4-B, includes a peripheral frame having a top surface 45 and a bottom surface 46 and includes a crossbar 43 extending intermediate opposite sides. Crossbar 43 is provided with a spacing dot 44 at its center that lies in the plane of the bottom peripheral surface adjacent of the center of diaphragm 36 to thereby limit the excursions of diaphragm 36 toward backplate 50 to a predetermined amount determined by the total thickness of spacer 42. Spacer 42 is fabricated from a suitable polyimide plastic, or dielectric, by the use of the patterns illustrated in FIG. 7 and an etching technique to be described below.

Figure 3:
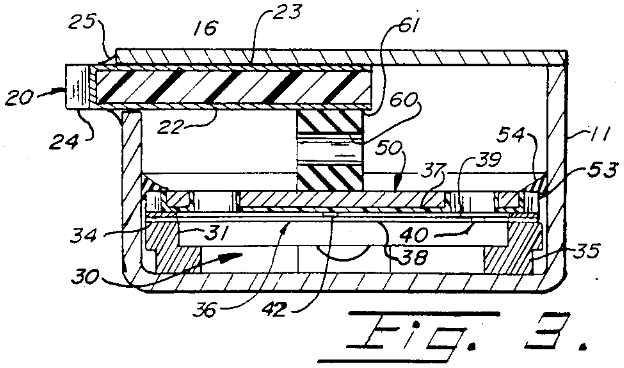
FIG. 3 is a side elevational sectional view of the transducer illustrated in FIG. 1 taken along section line 3—3.

A backplate 50, having an electret coating 51, is shown disposed on top of spacer 42 with electret coating 51 facing downwardly toward and into engagement with the peripheral top surface 45 of spacer 42. Backplate 51 and electret coating 51 are shown provided with a plurality of apertures 52 and is further provided with four insulated corner ears 54 extending laterally into engagement with the corners, or inside periphery of the sidewalls of case 11. As illustrated in FIGS. 3 and 5, the top peripheral portion of backplate 50 is suitably affixed and held in place to the inside of the sidewalls on case 11 by an insulating adhesive sealant 54.

The vertical sides of the outside periphery and the plurality of apertures 52 in backplate 50 are shown coated with the Teflon electret material.

Apertures 52 are dimensioned so that the final size of the aperture, after application of the electret film, is on the order of 0.010–0.030 inches. It is anticipated that the number and relative size, as between apertures 52, may vary and, in any event, the higher frequency characteristics of the transducer may be modified over a suitable range of the audio spectrum by suitable careful design and selection of the size and location of apertures 52.

A suitably configured resilient conductive connector 60 is shown intermediate the top conductive portion of backplate 50 and circuit board 20. Connector 60 is disposed in registration with a conductor 22 on the lower surface of circuit board 20 and may be mounted in place through the use of, for example, conductive epoxy resin applied to one or both of the top or bottom surfaces in engagement with a conductor 22 on circuit board 20 or the to surface of backplate 50 respectively.

Figure 6:
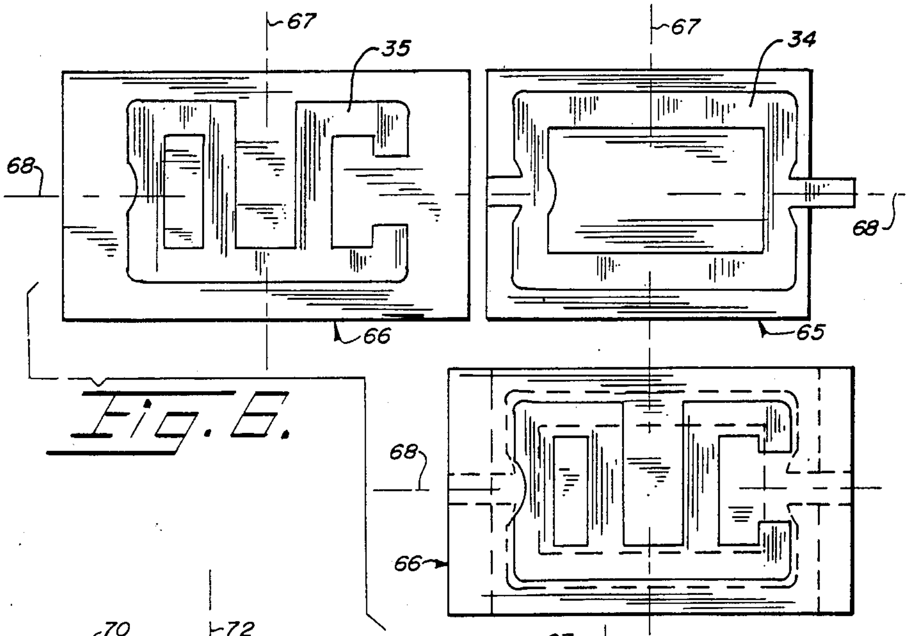
FIG. 6 is an enlarged drawing of the patterns to be used in fabricating the structure of the component of FIG. 4-A.
Figure 7:
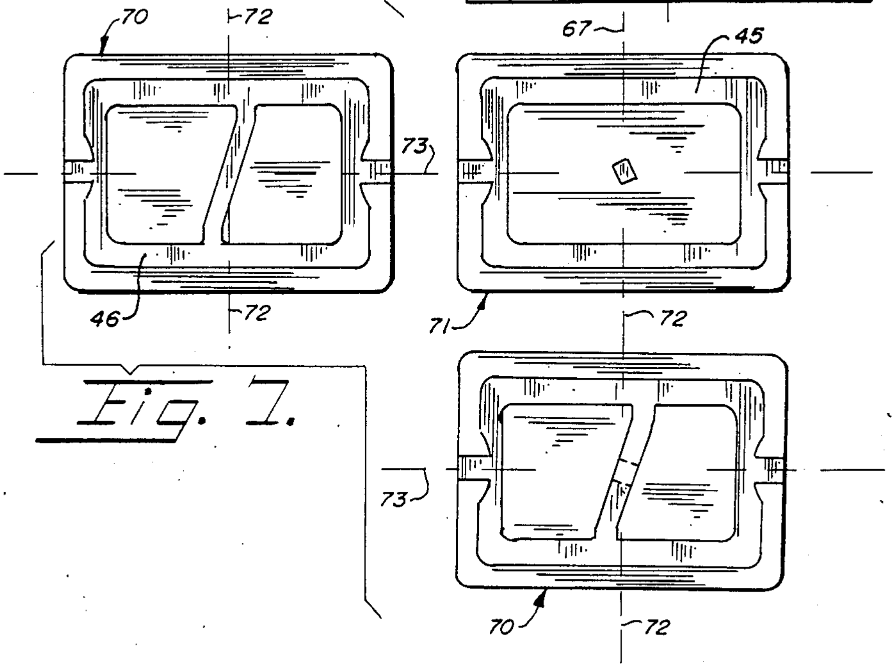
FIG. 7 is an enlarged drawing of the patterns to be used in fabricating the component of FIG. 4-B.

As an illustration of our improved method of fabrication of the components of our transducer, reference is made to FIGS. 6 and 7 which represent patterns of etchant resists that may be applied to opposed surfaces of a flat piece of material.

In FIG. 6 a pattern is illustrated for the fabrication of support-terminator 31 for the metallic conductive component illustrated in FIG. 4-A. Front and rear patterns 65 and 66 respectively are each provided with vertical and horizontal registration lines 67 and 68 respectively so that when placed on opposite major surfaces of a flat piece of material, a pattern of etchant resistant material may be deposited for further processing in the fabrication of the part. The lower sketch is comprised of patterns 65 and 66 superimposed as they will appear on the front and rear surfaces of the material.

Similarly, FIG. 7 shows patterns used in fabrication of spacer 42 of FIG. 4-B and include front and back patterns indicated by reference characters 70 and 71 and each including vertical and horizontal registration lines 72 and 73 respectively.

In each illustration, after the resist pattern has been applied to the opposed major surfaces of the sheet material, an etchant is applied to the material for a time substantially equal to two thirds of the total time that has been determined to etch completely through the thickness of the material. In this manner, the grooves, openings and crossbars on the lower portion of support-terminator 31 and the centrally open volume in the top portion are formed simultaneously as will be the case with the web and dot extending partially and fully from the bottom to the top surfaces of spacer 42.

Following the fabrication of backplate 50 by similar etching techniques, wherein complete registration of the resist may be utilized between the front and back patterns to etch completely through the holes and the outline, a Teflon electret film is applied to the sides and bottom surfaces of backplate 50.

Motor 30 is assembled into case 11 as follows: support-terminator 31, with diaphragm 36 in place, is disposed at the bottom of case 11 with opening 32 adjacent to aperture 13 and externally mounted snout 14 at the bottom of case 11, spacer 42 is disposed thereover with dot 44 extending downwardly into engagement with the center of diaphragm 36, backplate 50 is disposed thereover with Teflon electret coating 51 on top of spacer 42 and sealant 54 is disposed around the inside peripheral edges of casing 11 and the top of backplate 50 to complete the assembly. At this point, motor 30 may be tested.

The components for the signal processing apparatus are desposed on circuit board 20 and conductors 22 and circuit board 20 is mounted on the underside of cover 16. The assembly may also be tested.

Assuming that the signal processing apparatus on cover 16 and motor 30 are properly operative, conductive rubber connector 60 may be suitably attached either to a conductor 22 on the lower surface of circuit board 20 or to an appropriate registering location on the top conductive surface of backplate 50. Cover 16 may then be disposed over the top open end of case 11 with the notched portions 24 of circuit board 20 extending outwardly of the interior of case 11 and cover 16 is attached around its periphery as by welding or other suitable process. The clearance provided by the sidewardly facing opening in the top of one of the sidewalls of case 11 is sealed with an appropriate sealant to seal the interior of transducer 10 except for communication through the aperture 13 extending through snout 14 disposed on an exterior sidewall of case 11.

That which is claimed is:

1. In an electret transducer having a motor comprised of a flexible diaphragm and a flat rigid electret coated backplate disposed in spaced apart face to face relationship; spacer means disposed intermediate the diaphragm and backplate, said spacer means comprising a unitary structure having a uniform peripheral and central thickness for engaging the adjoining surfaces of the diaphragm and the backplate and operable to maintain a predetermined spacing between said diaphragm and said backplate at the center and peripheral portions thereof.

2. An electret transducer as in claim 1 which the spacer means engages the center of said diaphragm.

3. An electret microphone comprising;

(a) a sealed hollow housing including a cover and an aperture adjacent the bottom;

(b) transducer means disposed adjacent the bottom of said housing, said transducer means including a diaphragm and backplate disposed above the aperture in said housing;

(c) electrical signal processing means mounted on the inside of the cover of said housing; and (d) compressible resilient conductive means inside of said housing connecting said transducer means to said electrical signal processing means.

4. An electret microphone as in claim 3 in which terminals on the signal processing means extend outwardly of the hollow housing.

5. An electret transducer comprising:

(a) a conductive hollow housing having an open top end and an aperture opening into the bottom end in compressional wave transmitting relationship therewith;

(b) a unitary conductive diaphragm support member having a lower portion adapted to engage the bottom and sidewalls of said housing and including a peripherally disposed upper portion adapted to receive and support the edges of a diaphragm above the aperture in said housing;

(c) a flexible dielectric diaphragm having a conductive coating on the lower side thereof and edge portions conductively mounted on the peripherally disposed upper portion of said support member;

(d) unitary spacer means including a centrally disposed and peripheral portion of uniform thickness, disposed on top of said diaphragm;

(e) an electret backplate disposed on top of said spacer means, said backplate including a conductive upper surface and a lower dielectric surface disposed on top of said spacer means;

(f) a conductive cover mounted on the open top end of said housing;

(g) signal processing circuit means mounted on the underside of said cover and including an input terminal disposed inwardly of the inside periphery of said housing and further terminals extending outwardly through said housing;

(h) conductive means disposed intermediate the input terminal on said circuit means and the conductive top of said backplate; and (i) compressional wave sealing means extending between the periphery of said backplate and the inside periphery of said housing and said outwardly extending terminals and said housing.

6. An electret transducer as in claim 5 in which the conductive means connecting the electret backplate to the circuit means is resilient.

7. An electret transducer as in claim 5 in which the further terminals on the signal processing means terminate in a conductive notch for receiving and engaging a conductor.

8. A transducer for an electret microphone comprising, in combination;

a diaphragm having a conductive major surface and disposed over a rigid peripherally extendant mounting means;

spacer means disposed over said diaphragm, said spacer means consisting of a flat unitary structure having a peripheral portion co-extensive with the peripheral extendant portion of the mounting means for said diaphragm, a substantially open central portion and support means extending intermediate opposed portions on said peripheral portion, said support means being substanially the thickness of the peripheral portion at a central portion and of lesser thickness intermediate the central portion and the ends thereof; and a flat, rigid electret coated conductive backplate disposed and mounted over said spacer means whereby the central portions of said diaphragm and said backplate are maintained a predetermined minimum distance apart.

9. The method of fabricating a microphone comprising the steps of;

(a) fabricating an open ended hollow housing having an opening adjacent the closed end;

(b) fabricating a flat frame with an open central portion and a flat upwardly facing peripheral surface and an outwardly facing peripheral surface configured to be slidably disposed into the bottom of the hollow housing;

(c) stretching a metalized plastic diaphragm and adhering the same to the upwardly facing peripheral surface of said frame;

(d) disposing said frame and said diaphragm in the bottom portion of said housing;

(e) fabricating a flat spacer having a pheripheral portion coextensive with the upwardly facing peripheral portion of said frame and having an inwardly extending support portion for supporting a central portion of the same thickness as said peripheral portion;

(f) disposing said spacer on top of said diaphragm;

(g) fabricating an electret backplate having peripheral dimensions to be slidably received within said housing;

(h) disposing said backplate on top of said spacer;

(i) applying a bead of adhesive material around the peripheral extent of said backplate and onto said housing;

(j) testing the partially assembled housing, frame, diaphragm, spacer and backplate for operational integrity;

(k) fabricating a cover configured to be mounted on the open end of said housing;

(l) affixing signal processing means, including circuit means and terminals extending outside of said cover, to the underside of said cover;

(m) testing said signal processing means and circuit means for operational integrity;

(n) fabricating resilient conductive means dimensioned to be compressibly received intermediate said backplate and the circuit means on the underside of said cover;

(o) disposing said resilient conductive means on top of said backplate;

(p) affixing said cover to the open end of said housing; and (q) applying a sealant to the portions of said signal processing means extending through said housing and said housing.

10. The method of claim 9 in which the frame, spacer and backplate are fabricated according to the process of claim 8.

* * * * *